United States Patent [19]

Yamakawa et al.

[11] Patent Number: 4,906,341

[45] Date of Patent: Mar. 6, 1990

[54] METHOD OF MANUFACTURING SEMICONDUCTOR DEVICE AND APPARATUS THEREFOR

[75] Inventors: Koji Yamakawa; Kaoru Koiwa, both of Tokyo; Nobuo Iwase, Kamakura, all of Japan

[73] Assignee: Kabushiki Kaisha Toshiba, Kawasaki, Japan

[21] Appl. No.: 247,619

[22] Filed: Sep. 22, 1988

[30] Foreign Application Priority Data

Sep. 24, 1987 [JP] Japan ................................ 62-239818

[51] Int. Cl.$^4$ ............................................. C25D 5/02
[52] U.S. Cl. ...................................................... 204/15
[58] Field of Search ......................................... 204/15

[56] References Cited

U.S. PATENT DOCUMENTS 4,287,029 9/1981 Shimamura ........................... 204/15

FOREIGN PATENT DOCUMENTS 53-19147 2/1978 Japan .
53-37542 4/1978 Japan .

OTHER PUBLICATIONS

Solid State Technology: Mar. "Film Carrier Assembly Process" (1979) pp. 52–55.

Primary Examiner—T. M. Tufariello
Attorney, Agent, or Firm—Oblon, Spivak, McClelland, Maier & Neustadt

[57] ABSTRACT

A plating solution is stored in an annular plating solution storage. A plating solution tank having an open upper portion is arranged in a hollow portion of the storage. A mesh-like anode electrode is arranged on the bottom portion of the plating tank. Hold members are attached to an upper side wall of the plating tank. One of the hold members is in contact with a portion to be plated of a semiconductor member and serves as a cathode electrode. The anode and cathode electrodes are connected to a DC power source. The plating solution in the plating solution tank is brought into contact with the portion to be plated and is isolated therefrom by an driving pump intermittently driven at predetermined intervals using an intermittent drive unit. The power source is kept in the ON state while the plating solution is in contact with the portion to be plated, there-by forming a plated layer on the portion to be plated.

6 Claims, 4 Drawing Sheets

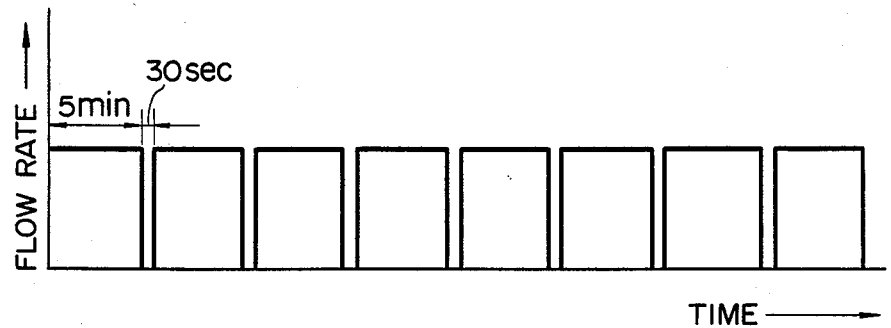
F I G. 3
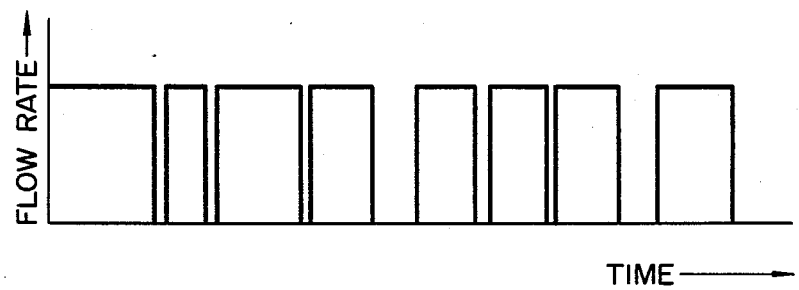
F I G. 4
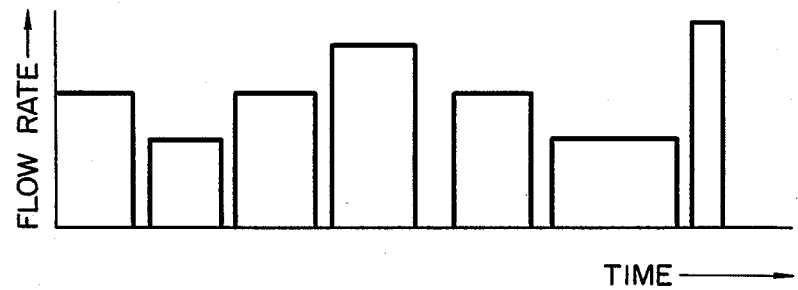
F I G. 5

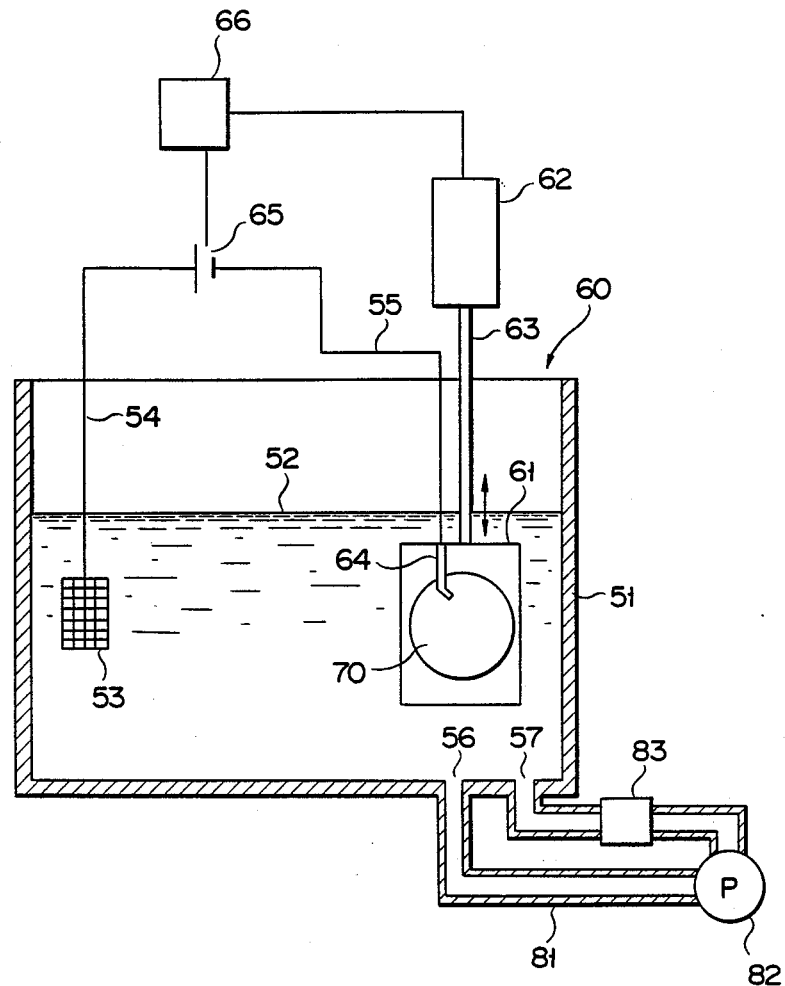
F I G. 6

METHOD OF MANUFACTURING SEMICONDUCTOR DEVICE AND APPARATUS THEREFOR

BACKGROUND OF THE INVENTION

1. Field of the Invention

The present invention relates to a method of manufacturing a semiconductor device by way of forming bumps, wiring lines, or the like by plating, and an apparatus therefor.

2. Description of the Related Art

Recently, with the advancement of miniaturization of electronic devices, integration densities of ICs and LSIs have been increased. Furthermore, in mounting of semiconductor elements, an electrode pitch is reduced and the number of I/O terminals is increased. In order to respond to a trend that electronic devices are formed into card-like shapes, e.g., card type calculators and IC cards, a demand has arisen for low-thickness of the electronic devices.

A semiconductor element has aluminum electrodes. In a mounting operation, these aluminum electrodes are connected to external terminals. Wire bonding is well known as a method of connecting them. In wire bonding, very thin Au (Al or Cu) wire having a diameter of 25 to 30 $\mu$m are sequentially connected by thermocompression or an ultrasonic technique. In this method, automatic wire bonders have been widely applied to save labor, and hence high reliability and productivity are realized. However, it is difficult to respond to demand of an increase in the number of pins, reduction in pitch, and reduction in thickness of electronic devices mounting semiconductor elements, associated with the increase in integration density of semiconductor elements. That is, a longer time is required for bonding as the number of pins is increased, and the reduction in pitch and the reduction in thickness of the electronic devices are interfered because of the presence of connecting wires.

In contrast to the above method, wireless bonding such as the TAB and flip chip methods, to which a great deal of attention has been paid, can solve the above-described problems. According to this method, since no wire is used, one-step bonding can be performed, and reduction in pitch and reduction in thickness of electronic devices can be realized. In addition, automation of this wireless bonding method is promoted. Thus, it is expected that wireless bonding becomes the mainstream of mounting techniques of semiconductor elements from now on.

Generally, in wireless bonding, metallic projections called bumps are formed on aluminum electrodes of semiconductor elements, and the bumps are directly connected to external electrode terminals (Solid State Technology. Mar. "Film Carrier Assemly Process" (1979) p. 52)x' In a conventional method. the bumps are formed by the following process.

First, a plurality of semiconductor elements are formed on a semiconductor wafer, and a large number of aluminum electrodes are formed on the respective semiconductor elements.

A passivation film such as an $SiO_2$ or $Si_3N_4$ film is formed on the entire surface of the wafer. The passivation film is selectively etched to expose the aluminum electrodes.

An underlying metal film is formed on the entire surface of the wafer (including the residual portion of the passivation film) by deposition or sputtering. Then, a resist film is formed on the underlying metal film by photoengraving such that portions of the underlying metal film corresponding to the exposed portions of the aluminum electrodes are formed into openings.

Subsequently, bumps each having substantially the same thickness as that of the resist film are formed on portions corresponding to the resist film opening portions of the underlying metal layer by electroplating using the underlying metal film as a cathode.

Then, the resist film is removed, and the exposed underlying metal film is removed using the bumps as masks.

The above-described conventional bump forming method, however, has the following drawbacks. In a plating process, if bubbles entrapped in a plating solution are attached to the underlying metal and the resist in the neighborhood of the opening portions of the resist film, the bubbles are not removed even if the plating solution is agitated, and plating is performed while the bubbles are attached to the underlying metal and the resist. As a result, no bump may be formed or bumps having insufficient thicknesses may be formed. Especially, as a bump size is decreased with advances in micropatterning of the semiconductor elements, even a small bubble may serve as a mask in a plating and interferes with formation of bumps. Therefore, attachment of bubbles causes a great decrease in yield of semiconductor elements.

In order to eliminate such drawbacks, a surface-active agent is added to a plating solution to prevent bubbles from being attached to an underlying metal layer etc. Such a surface-active agent, however, degrades characteristics of the plating solution, thus posing another problem.

SUMMARY OF THE INVENTION

It is an object of the present invention to provide a method of manufacturing a semiconductor device, which can prevent a plating failure caused by the attachment of bubbles to a plating portion of the semiconductor device without changing the composition of a plating solution, and an apparatus therefor.

A method of manufacturing a semiconductor device according to the present invention comprises the steps of plating a portion of a semiconductor member to be plated by bringing a plating solution into contact with the portion to be plated, and isolating the portion to be plated from the plating solution during the plating step.

A manufacturing apparatus for a semiconductor device according to the present invention comprises a plating solution tank for storing a plating solution, a hold member for holding a semiconductor member in the tank, bringing/isolating means for bringing the plating solution into contact with the portion to be plated of the semiconductor member and for isolating the plating solution from the portion to be plated, and plating means for forming a plating layer on the portion to be plated while the plating solution is contacting the portion to be plated of the semiconductor member.

BRIEF DESCRIPTION OF THE DRAWINGS

FIGS. 3 to 5 are graphs showing ON/OFF timings of a pump for supplying a plating solution and the flow rates of the plating solution of the pump; and FIG. 6 is schematic view showing an arrangement of a bump forming apparatus to be used in a second embodiment of the present invention.

DETAILED DESCRIPTION OF THE PREFERRED EMBODIMENTS

Figure 1:
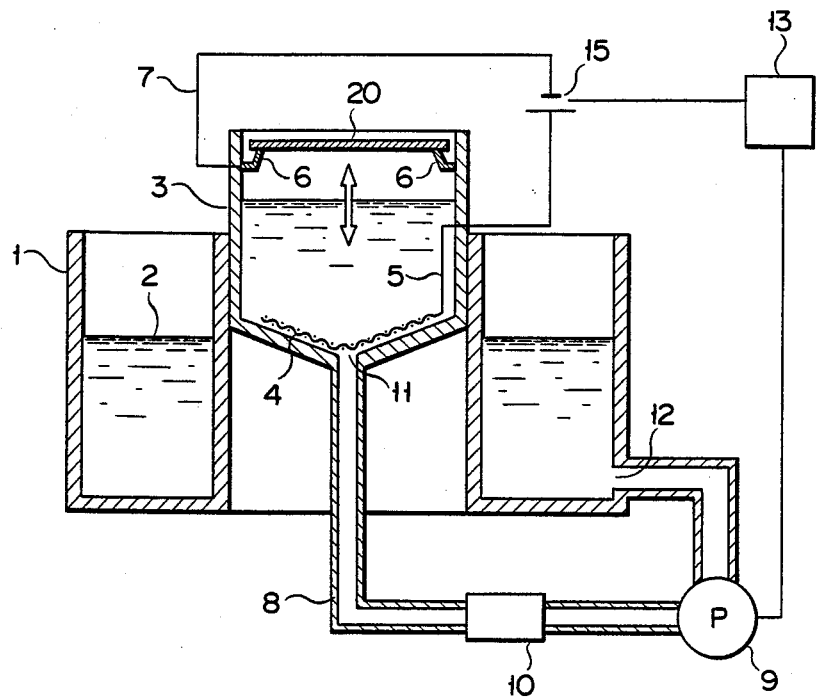
FIG. 1 is a schematic view showing an arrangement of a bump forming apparatus to be used in a first embodiment of the present invention.

The present invention will be described in detail below. A method of manufacturing a semiconductor device according to the present invention can be applied to, e.g., the manufacturing of a semiconductor device having bumps. Such a semiconductor device is manufactured as follows. For example, an insulating film is formed on a surface of a semiconductor member such that a large portion of each electrode formed on the semiconductor device is exposed. The insulating film and the entire exposed surface portion of the electrode are covered with a conductive film. A mask having an opening for exposing a portion of the conductive film corresponding to the exposed portion of the electrode is formed on the conductive film, and a bump is formed on the exposed portion (portion to be plated) of the conductive film by depositing, thereon, a plating layer having a predetermined thickness. According to the present invention, plating is performed by bringing the plating solution into contact with a portion to be plated of the semiconductor device and isolating the solution from the portion to be plated of the semiconductor device during the plating step. With the above operation, the occurrence of a plating failure caused by bubbles can be greatly reduced.

The reasons why such effects are obtained with the method of the present invention will be described below. During formation of a plating layer in the conventional method of manufacturing a semiconductor device, bubbles attach themselves to a certain area of a portion to be plated, and the bubbles remain thereon during a plating process. Therefore, a plating layer is not formed on the portion to which the bubbles are attached and thus a plating failure occurs on this portion. These bubbles, however, can be removed by temporarily isolating the portion of the semiconductor device to be plated from the plating solution. When the portion to be plated is again brought into contact with the plating solution after the isolation, the bubbles have attached themselves to the other area which has already been plated. Thus, the plating solution contacts the previously bubble-attached area, and a plating layer is deposited on this area. As a result, the portion has no area left unplated. Hence, the possibility of a plating failure is minimized. In this case, the step of isolating the portion to be plated from the plating solution is preferably performed a plurality of times, more preferably, ten times or more. By performing this step a plurality of times, the probability that the bubbles have again attached themselves to an area of the portion to be plated, to which the bubbles had been previously attached, is decreased, and hence a plating failure can reliably be further prevented. In the case wherein the plating solution is isolated from the portion to be plated a plurality of times, the interval between one isolating step and the next isolating step the time, during which plating is performed, is short, thereby allowing only a thin plating layer to be deposited on the portion to be plated during the interval. For this reason, even if bubbles remain attached to a certain area of the portion to be plated after plating has been restarted, a difference in thickness of deposition between the area to which the bubbles are attached and the other areas will be smaller than in the case wherein this isolating step is performed only once. Therefore, the plated layer on the portion to be plated can be deposited to have a substantially uniform thickness by performing this isolating step a preferable number of times.

Note that the number of times the isolating step is to be performed is preferably determined in consideration of the properties of the plating solution (the number of bubbles and the like in the plating solution), the thickness of a plating layer to be formed, and productivity of a semiconductor device. In addition, when the isolating step is performed a plurality of times, the intervals between one isolating step and the next isolating step is preferably uniform.

Electroplating can be applied to the plating step. In this case, gold-plating, silver-plating, or the like can be employed. In addition, electroless plating can be employed.

The present invention is not limited to the case wherein bumps are formed, but can be applied to a case wherein, e.g., wiring lines are plated.

Embodiments of the present invention will be described in detail below with reference to the accompanying drawings.

FIG. 1 is a schematic view showing an arrangement of an apparatus to be used in a first embodiment of the present invention. Referring to FIG. 1, reference numeral 1 denotes an annular plating storage, in which plating solution 2 is stored.

Plating tank 3 having an open upper portion is arranged in a hollow portion of annular plating solution storage 1. Mesh-like anode electrode 4 is arranged on a bottom portion of plating tank 3. Lead 5 is connected to electrode 4. Three hook-shaped hold members 6 (two in FIG. 1) are attached to an upper side wall of plating tank 3. Semiconductor wafer 20, on which a plating portion is to be formed, is placed on hold members 6. One of hold members 6 is connected to lead 7 on the cathode side and serves as a cathode electrode. Leads 5 and 7 are connected to DC power source 15.

Plating solution discharging port 12 is formed in a lower side wall of plating solution storage 1. Plating solution-supplying port 11 is formed in the bottom portion of plating tank 3. Discharging and supplying ports 12 and 11 are coupled to each other through pipe 8. Pump 9 and filter 10 are provided in pipe 8. Pump 9 supplies a plating solution from storage 1 to tank 3. Filter 10 filters the plating solution. Intermittent drive unit 13 is connected to pump 9. Pump 9 is intermittently operated by intermittent drive unit 13 at predetermined intervals. In addition, intermittent drive unit 13 is connected to DC power source 15 described above. DC power source 15 is synchronized with pump 9 and is ON/OFF-operated in accordance with the ON/OFF intervals of pump 9.

In such an apparatus, intermittent drive unit 13 is operated at predetermined intervals while semiconductor wafer 20 is placed on hold members 6. When intermittent drive unit 13 is in the ON state, pump 9 is operated, and hence plating solution 2 is caused to flow from storage 1 to plating tank 3 through pipe 8. When plating tank 3 is filled with the plating solution, the plating solution begin to overflow from tank 3. At this time, the plating solution is brought into contact with a portion to be plated of semiconductor wafer 20, and a voltage is applied from DC power source 15 to anode electrode (mesh) 4 and hold member 6, thereby performing the step of plating. When intermittent drive unit 13 is in the OFF state, the plating solution in plating tank 3 is returned to plating solution storage 1 through pipe 8. Then, the plating solution is isolated from the portion to be plated, and DC power source 15 is turned off. With such an intermittent plating operation, plating portions such as bumps, wiring lines, or the like can be formed to have very few defects due to the elimination of bubbles.

A method of forming bumps using the above-described apparatus will be described below with reference to FIGS. 2A to 2D.

Figure 2A:
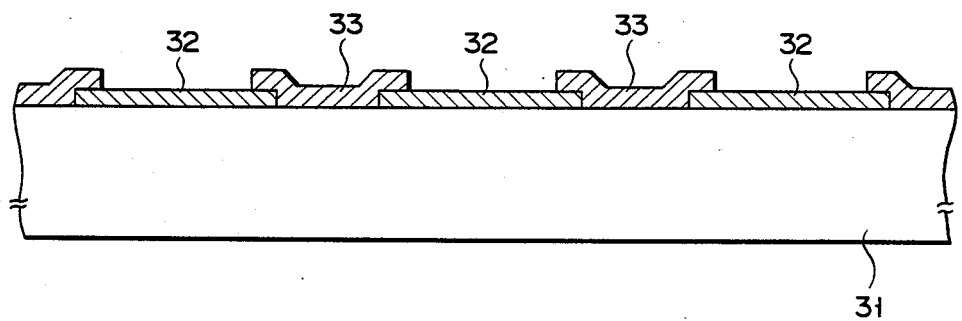
FIGS. 2A to 2D are sectional views for explaining the steps involved in forming bumps on a semiconductor wafer.

A plurality of semiconductor elements comprising various transistors and wiring lines were formed on silicon wafer 31 by a conventional method, and a large number of Al electrodes 32 were formed on the respective semiconductor elements. Then, $Si_3N_4$ passivation film 33 was formed on an upper surface of wafer 31, on which electrodes 32 had been formed. Passivation film 33 was selectively etched to exposed a large portion of each Al electrode 32 (FIG. 2A).

Figure 2B:
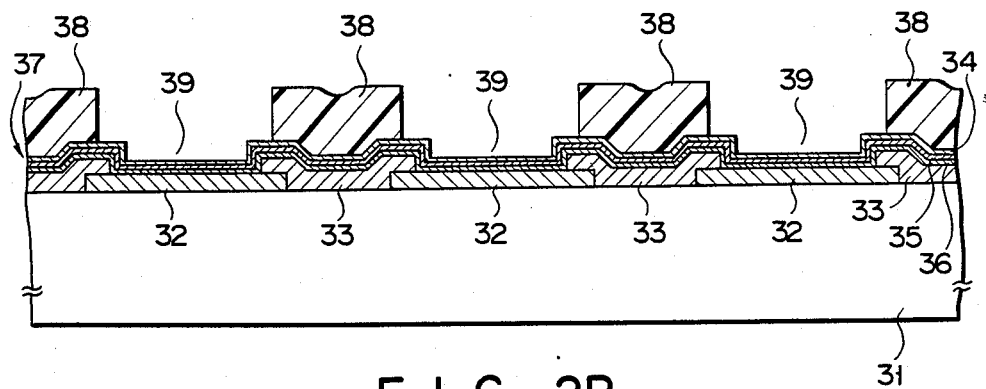

Cr film 34, Cu film 35, and Au film 36 were sequentially deposited on the entire surface of wafer 31 including passivation film 33 by sputtering to form 3-layer conductive film 37 having a thickness of about 3,500 Å. After 20-$\mu$m thick photosensitive dry film 38 had been coated on the entire surface of conductive film 37, film 38 was photo-engraved to form opening portions 39, each having a square area of 80 $\mu$m×80 $\mu$m for exposing portions of the conductive film, which corresponded to the exposed portions of Al electrodes 32 (FIG. 2B).

Figure 2C:
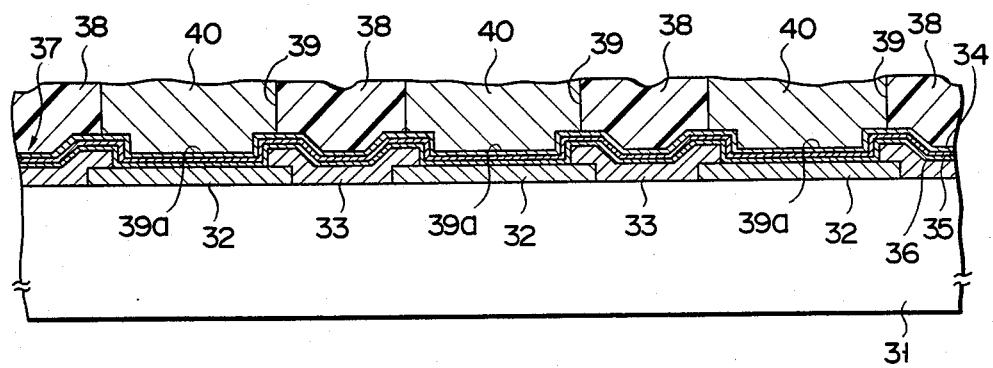

Silicon wafer 31 was placed on hold members 6 of plating tank 3 in FIG. 1 such that the surface of photosensitive dry film 38 coated thereon faced tank 3. In this case, hold members 6 were connected to conductive film 37. Pump 9 was driven by intermittent drive unit 13 at intervals shown in FIG. 3 to intermittently perform electroplating. More specifically, a plating solution was supplied to tank 3 for five minutes at a predetermined flow rate, thus plating was performed. The plating solution was isolated from wafer 31 by stopping the supply of the plating solution for 30 seconds. These operations were repeated seven times. Finally, the plating solution was supplied to tank 3 for five minutes, thus plating was performed. Thereby, metal bumps 40 were selectively formed on the exposed portions corresponding to opening portions 39 of conductive film 37 to have substantially the same thickness as that of film 38 (FIG. 2C).

In this plating operation, upon the operation of pump 9, the gold plating solution (temperature: about 60° C.) in plating storage 1 was caused flow to plating tank 3 through pipe 8, thereby raising the level of plating solution 2 in plating tank 3. The plating solution was brought into contact with portions 39a (corresponding to opening portions 39) of conductive film 37 after about two seconds, and a DC voltage was applied from power source 15 to hold member 6 and electrode 4, thereby gold-plating portion 39a. In this case, the plating solution was agitated when it was being supplied to tank 3. After the level of the plating solution had reached the upper end of tank 3, the plating solution supplied thereafter overflowed therefrom into storage 1. On the other hand, by turning off intermittent drive unit 13 during the plating process and by stopping the operation of pump 9, plating solution 2 was returned to storage 1 and the level of the plating solution was lowered to position L. In this case, plating solution 2 was instantaneously separated from portions 39a, and bubbles attached thereto were removed.

Figure 2D:
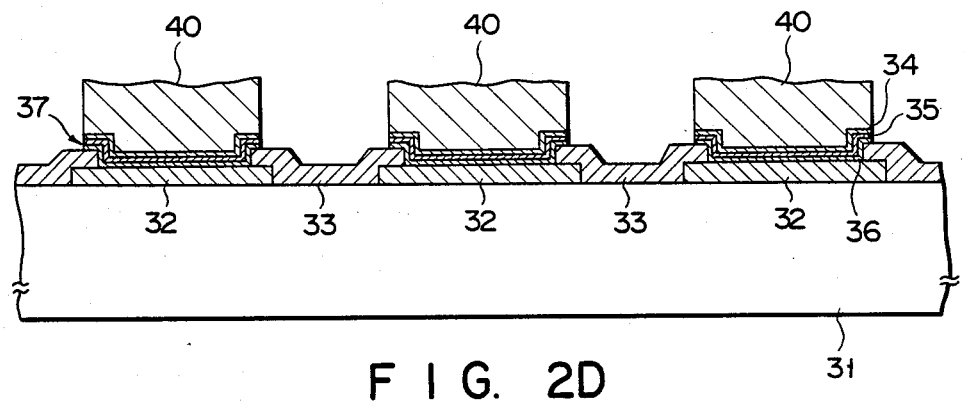

Thereafter, dry film 38 was removed, and then exposed conductive film 37 were removed by etching using the metal bumps as masks (FIG. 2D).

Wafer 31 having metal bumps 40 formed thereon in the above-described manner were checked to determine the shapes of the bumps 40 and whether or not the bumps had been formed on portions 39a. It was resultingly confirmed that bumps having uniform thicknesses were formed on all portions 39a. In contrast to the above embodiment, bumps were formed on another wafer by continuously plating the wafer for 40 minutes without isolating the plating solution from the wafer during the process. As a result, of the 200 ICs made on one wafer, there were 60 ICs (about 30% of the total ICs) wherein no bumps or bumps having a thickness less than 20 $\mu$m were formed on the bump-forming portions (i.e., portions 39a).

A plurality of semiconductor elements were formed by cutting wafer 31 in this embodiment. Then, the semiconductor elements were mounted on external wiring lines. More precisely, gold bumps 40 were mounted on the extermal wiring lines. As a result, the semiconductor elements were found to have a high reliablity and an excellent bonding ability.

According to the apparatus shown in FIG. 1, since intermittent drive unit 13 drives DC power source 15 to perform the ON/OFF operation and drives pump 9 to perform the start/stop operation in synchronism with each other, a plating solution can be easily isolated from portions 39a of wafer 31, and a bump formation with a high reliability can be realized.

In the above embodiment, the conductive film is constituted by the laminated layer of three films, i.e., the Cr film, the Cu film, and the Au film. However, the conductive film may be constituted by a 3-layer structure of other metals such as a Ti/Pt/Au layer.

Although the photosensitive dry film is used as a mask in the bump forming process, a resist film may be used.

Although the plating solution is supplied by pump 9 at a predetermined flow rate and at predetermined intervals as shown in FIG. 3, it may be supplied at irregular intervals as shown in FIG. 4, or the flow rate may be varied as shown in FIG. 5.

A second embodiment of the present invention will be described below. FIG. 6 is a schematic view showing an arrangement of an apparatus to be used in the second embodiment of the present invention. Referring to FIG. 6, plating solution 52 such as a gold plating solution is stored in plating tank 51. Mesh-like anode electrode 53 is arranged in tank 51 and immersed in plating solution 52. Anode electrode 53 is connected to lead 54, which, in turn, is connected to DC power source 65.

Plating apparatus 60 comprises hold plate 61 for holding wafer 70, actuator 62 for vertically moving wafer 70 so as to immerse wafer 70 in plating solution 52 and to remove wafer 70 therefrom, support rod 63 for coupling actuator 62 to support plate 61, and contact pin 64 for connecting wafer 70 to the cathode side of power source 65. Contact pin 64 is connected to lead 55, which, in turn, is connected to power source 65. Drive controller 66 drives actuator 64 at predetermined intervals to vertically move wafer 70, and keeps power source 65 in an ON state only while wafer 70 is immersed in plating solution 52.

Two holes 56 and 57 are formed in the bottom portion of tank 51. Both ends of pipe 81 are connected to holes 56 and 57. Pump 82 and filter 83 are provided in pipe 81. Pump 82 circulates plating solution 52 in tank 81 so as to agitate the solution. Filter 83 purifies plating solution 52.

With such an apparatus, by operating actuator 62 at predetermined intervals using drive controller 66, operations of isolating the plating solution from the portions of wafer 70 to be plated and bringing the plating solution into contact with the portions are alternately repeated, and thus defects of plating portions can be minimized.

Bump formation using such an apparatus can be basically performed in accordance with the steps shown in FIGS. 2A to 2D described above.

In this embodiment, bumps having the same excellent qualities as those in the first embodiment can be obtained.

What is claimed is:

1. A method of manufacturing a semiconductor device having a semiconductor member with plural portions to be plated, comprising the steps of:
    commencing plating of said portions of said semiconductor member by bringing a plating solution into soaking contact with said plural portions of said semiconductor member;
    temporarily interrupting plating of said portion by isolating said plating solution from said portions to be plated so that said portions are temporarily not in soaking contact with said plating solution; and
    recommencing plating by again bringing said portions to be plated into soaking contact with said plating solution.

2. A method according to claim 1, wherein said temporarily interrupting and recommencing plating steps are performed a plurality of times.

3. A method according to claim 1, wherein said commencing and recommencing plating steps are performed by electroplating.

4. A method according to claim 1, wherein said commencing and recommencing plating steps are performed by electroless plating.

5. A method according to claim 1, wherein plural bumps are formed by said commencing and recommencing plating steps.

6. A method of manufacturing a semiconductor device having a semiconductor member provided with plural bumps, comprising the steps of:
    forming an insulating film on a surface of a semiconductor member so as to expose portions of electrodes formed on said semiconductor member;
    coating a conductive film on the insulating film and on an entire surface of each of said exposed portions of said electrodes;
    forming opening portions above said conductive film so as to expose portions of said conductive film corresponding to said exposed portions of said electrode; and
    forming bumps on said conductive film, comprising,
    bringing said plating solution into soaking contact with said exposed portions of said conductive film and commencing plating of said exposed portions,
    temporarily interrupting plating of said exposed portions by isolating said plating solution from said exposed portions of said conductive film so that said exposed portions are temporarily not in contact with said plating solution, and
    again bringing said exposed portions into soaking contact with said plating solution to recommence plating of said exposed portions, thereby to form said bumps.

* * * * *